United States Patent
Eriksson

(10) Patent No.: US 6,564,184 B1
(45) Date of Patent: May 13, 2003

(54) DIGITAL FILTER DESIGN METHOD AND APPARATUS

(75) Inventor: Anders Eriksson, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 131 days.

(21) Appl. No.: 09/656,295

(22) Filed: Sep. 6, 2000

(30) Foreign Application Priority Data

Sep. 7, 1999 (SE) ............................................. 9903160

(51) Int. Cl.$^7$ ............................................. G10L 21/02

(52) U.S. Cl. ........................ 704/226; 704/228; 704/222

(58) Field of Search ................................ 704/226, 230, 704/234, 270, 227, 228; 708/300, 310, 314, 323

(56) References Cited

U.S. PATENT DOCUMENTS

| | | | |
|---|---|---|---|
| 4,658,426 A | | 4/1987 | Chabries et al. |
| 4,811,398 A | * | 3/1989 | Copperi et al. .............. 704/230 |
| 5,394,473 A | | 2/1995 | Davidson |
| 5,729,694 A | * | 3/1998 | Holzrichter et al. ......... 704/270 |
| 5,839,101 A | | 11/1998 | Vähätalo et al. |
| 5,864,806 A | * | 1/1999 | Mokbel et al. .............. 704/234 |

FOREIGN PATENT DOCUMENTS

| WO | 96/24128 | 8/1996 |
|---|---|---|

OTHER PUBLICATIONS

Van de Wouw et al ("Statistical Bilinearization In Stochastic Nonlinear Dynamics", 2nd International Conference on Control of Oscillations and Chaos, Jul. 2000).*

Chuang et al ("Adaptive Two–Band Spectral Subtraction With Multi–Window Spectral Estimation", International Conference on Acoustics, Speech, and Signal Processing, Mar. 1999).*

Flores et al ("Continuous Speech Recognition In Noise Using Spectral Subtraction And HMM Adaptation", IEEE International Conference on Acoustics, Speech, and Signal Processing, Apr. 1994).*

Sheikhzadeh et al ("Comparative Performance Of Spectral Subtraction And HMM–Based Speech Enhancement Strategies with Application to Hearing And Design", IEEE International Conference on Acoustics, Speech, and Signal Processing, Apr. 1994).*

(List continued on next page.)

*Primary Examiner*—Doris H. To
*Assistant Examiner*—Daniel Nolan

(57) ABSTRACT

A digital filter design apparatus for noise suppression by spectral subtraction includes a first spectrum estimator for determining a high frequency resolution noisy speech power spectral density estimate from a noisy speech signal block. A second spectrum estimator determines a high frequency resolution background noise power spectral density estimate from a background noise signal block. Averaging units form a piece-wise constant noisy speech power spectral density estimate and a piece-wise constant background noise power spectral density estimate. These averaging units are controlled by devices for adapting the length of individual segments to the shape of the high frequency-resolution noisy speech power spectral density estimate and for using the same segmentation in both piecewise constant estimates. A piece-wise constant digital filter transfer function is determined using spectral subtraction-based on the piece-wise constant noisy speech power spectral density estimate and the piece-wise constant background noise power spectral density estimate.

20 Claims, 4 Drawing Sheets

OTHER PUBLICATIONS

Matsumoto et al ("Smoothed Spectral Subtraction For A Frequency–Weighted HMM In Noisy Speech Recognition", ICSLP Fourth International Conference on Spoken Language, Oct. 1996).*

S.F. Boll, "Suppression of acoustic noise in speech using spectral subtraction", IEEE Trans. on Acoustics, Speech and Signal Processing, vol. ASSP–27, No. 2, Apr. 1979, pp. 113–120.

J.S. Lim and A.V. Oppenheim, "Enhancement and bandwidth compression of noisy speech", Proc. of IEEE, vol. 67, No. 12, Dec. 1979, pp. 1586–1604.

U. Zölser, "Digital audio signal processing", John Wiley & Sons, Chichester, U.K., 1997 pp. 252–253.

* cited by examiner

DIGITAL FILTER DESIGN METHOD AND APPARATUS

TECHNICAL FIELD

The present invention relates to a digital filter design, and especially to filter design in the frequency domain.

BACKGROUND

There are several applications in which digital filters H[k] are designed "on the fly" in the frequency domain. One example is noise suppression using spectral subtraction. Another example is design of frequency selective non-linear processors for echo cancellation. A characteristic feature of such applications is that the filter design method is quite complex. Since the is filters are updated frequently this puts a heavy burden on the hardware/software that implements these design algorithms.

Reference [1] describes a method that divides the frequency domain k into segments of equal or unequal length, and uses a constant value in each segment for H[k] and the underlying power spectral density estimates $\Phi_x[k]$ of the noisy or echo contaminated speech signal. This reduces the complexity, since the filter H[k] only has to be determined for the frequency segments and not for each frequency bin k. However, this method also has the draw-back that it may split a peak of H[k] into two different segments. This may lead to fluctuating peaks, which produces annoying "music noise". It also reduces spectral sharpness, which further reduces speech quality.

SUMMARY

An object of the present invention is to reduce or eliminate these drawbacks of the prior art.

This object is achieved in accordance with the attached claims.

Briefly, the present invention dynamically adapts the segment lengths and positions to the current shape of the power spectrum of the speech signal. The peaks and valleys of the spectrum are determined, and the method makes sure that peaks are not split between different segments when the segments are distributed over the frequency domain. Preferably each peak is covered by a segment centered on the peak. The segment length is preferably controlled by the frequency characteristics of the human auditory system.

This method has the advantage of reducing the complexity of the filter calculation without sacrificing accuracy at the important spectrum peaks. Furthermore, the method also reduces the variance of the spectrum from frame to frame, which improves speech quality.

BRIEF DESCRIPTION OF THE DRAWINGS

The invention, together with further objects and advantages thereof, may best be understood by making reference to the following description taken together with the accompanying drawings, in which.

DETAILED DESCRIPTION

In some applications the filter is determined in the frequency domain. For example, in telephony applications noise suppression based on spectral subtraction is often used (see [2, 3]). In this case the filter is determined as a function $H(\omega)$ of frequency:

$$H(\omega) = \left(1 - \left(\delta\left(\frac{\hat{\Phi}_v(\omega)}{\hat{\Phi}_v(\omega)}\right)\right)^\alpha\right)^\beta$$

where $\alpha$, $\beta$, $\delta$ are constants and $\hat{\Phi}_v(\omega)$ and $\hat{\Phi}_x(\omega)$ are estimates of the power spectral density of the pure noise and noisy speech, respectively. This expression is obtained from the model:

$$x[n]=y[n]+v[n]$$

where v[n] is the noise signal, x[n] is the noisy speech signal and y[n] is the desired signal. An estimate of the desired signal y[n] is obtained by applying the filter represented by $H(\omega)$ to the noisy signal x[n].

Another example of an application in which the filter is determined in the frequency domain is a frequency selective non-linear processor for echo cancellation. In this case the filter is defined by the function:

$$H(\omega)=f(\hat{\Phi}_x(\omega),\hat{\Phi}_e(\omega))$$

where $\hat{\Phi}_x(\omega)$ represent an estimate of the power spectral density of a signal x[n] contaminated by residual echo and $\hat{\Phi}_e(\omega)$ represents an estimate of the power spectral density of the residual echo signal e[n]. An example of a suitable function $f$ is the function above for noise suppression with $\hat{\Phi}_x(\omega)$ now representing the power spectral density estimate of the residual echo contaminated signal and $\hat{\Phi}_v(\omega)$ being replaced by the residual echo power spectral density estimate $\hat{\Phi}_e(\omega)$ The filter $H(\omega)$ is based on the model:

$$x[n]=y[n]+e[n]$$

where y[n] is the desired signal. An estimate of the desired signal y[n] is obtained by applying the filter represented by $H(\omega)$ to the residual echo contaminated signal x[n].

In the above examples the filter is described by a real-valued continuous-frequency transfer function $H(\omega)$. This function is sampled to obtain a discrete-frequency transfer function H[k]. This step is typically performed when the estimates are based on parametric estimation methods. However, it is also possible to obtain the discrete-frequency transfer function H[k] directly, for example by using periodogram based estimation methods. An advantage of parametric estimation methods is that the estimates typically have lower variance from frame to frame than estimates from periodogram based methods.

The following description will be restricted to noise suppression, but it is appreciated that the same principles may also be used in other applications, such as echo cancellation.

Figure 1:
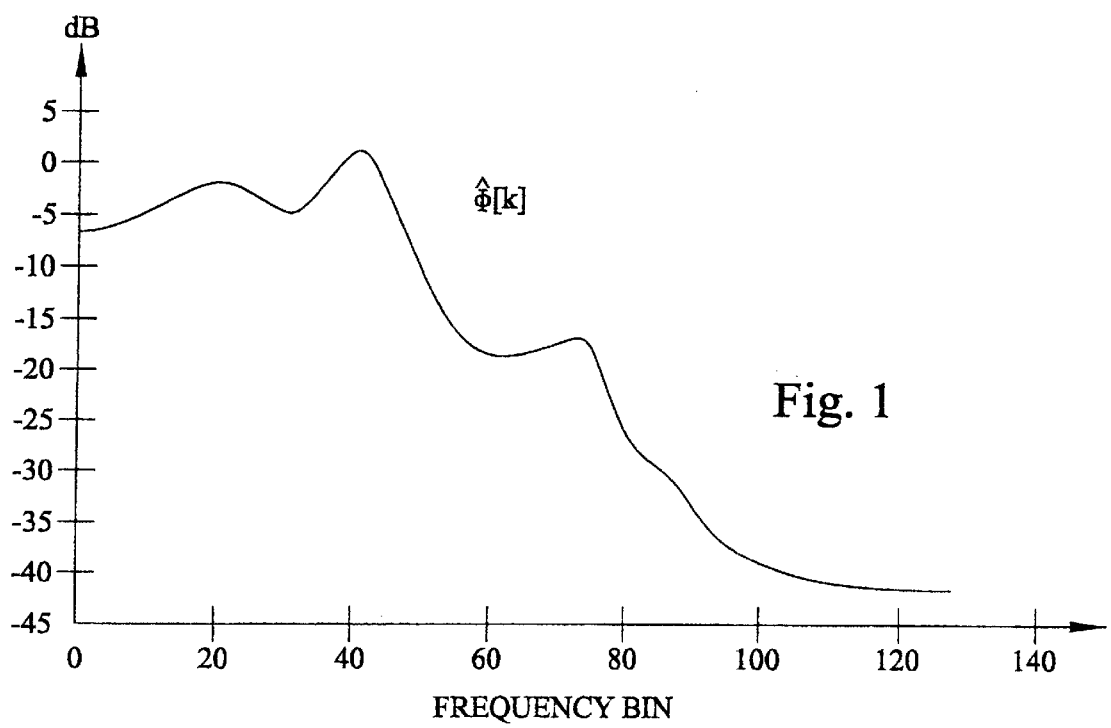
FIG. 1 is a diagram illustrating the power spectral density estimate of a noisy speech signal.
Figure 2:
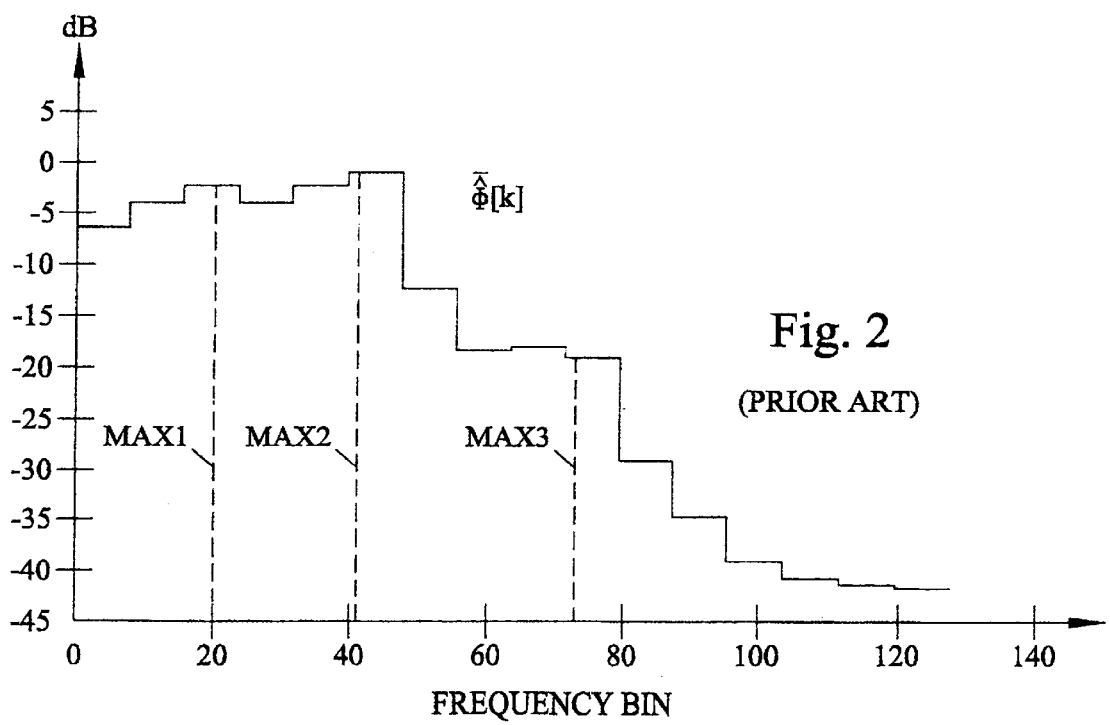
FIG. 2 is a diagram illustrating the power spectral density estimate in FIG. 1 after segmentation and averaging in accordance with the prior art.
Figure 3:
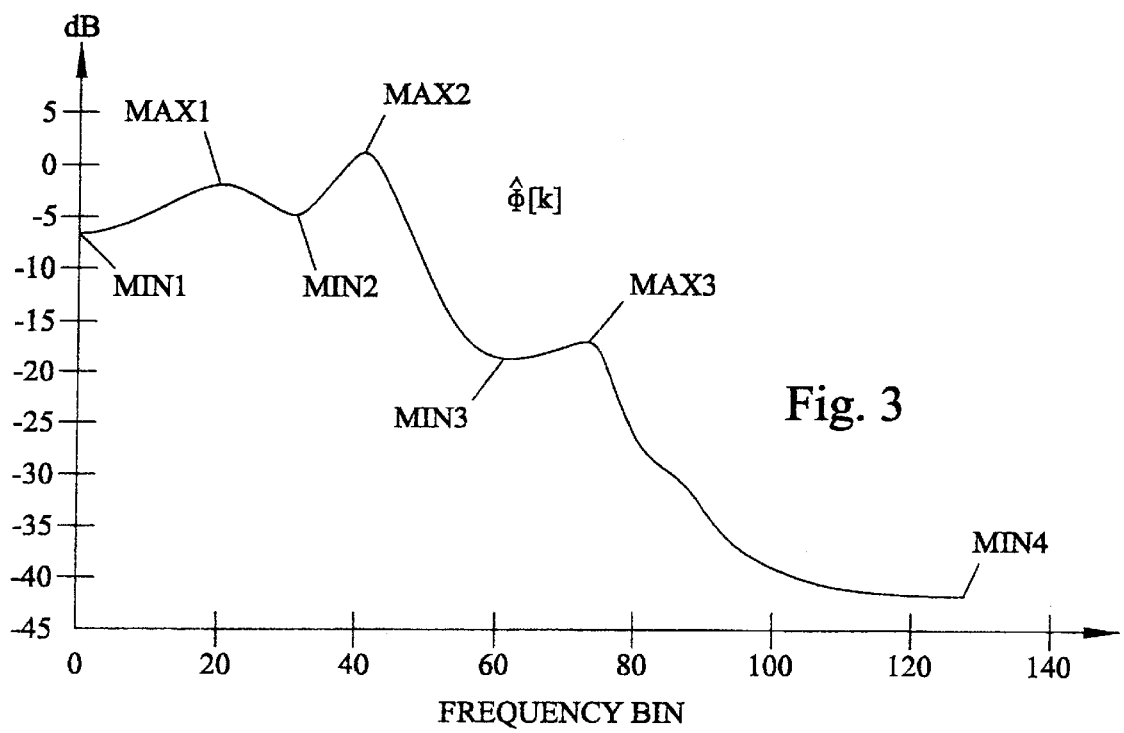
FIG. 3 is a diagram similar to the diagram in FIG. 1.

The discrete-frequency power spectral estimates $\hat{\Phi}_x[k]$, $\hat{\Phi}_v[k]$ are initially known with high frequency resolution, typically 128 or 256 frequency bins. FIG. 1 is a diagram illustrating the power spectral density estimate $\hat{\Phi}_x[k]$ of a noisy speech signal, in this case with 256 frequency bins. This spectrum is obtained from a parametric estimation method (typically an auto-regressive model, for example of order 10). If the filter transfer function H[k] is to be determined with the same resolution, this will put a heavy computational burden on the hardware/software that implements the noise suppression algorithm described above. In accordance with [1] the frequency range is therefore divided into constant length segments, and an average of $\hat{\Phi}_x[k]$ is formed within each segment, as illustrated in FIG. 2. This average $\overline{\hat{\Phi}}_x[segment]$ is used instead of $\hat{\Phi}_x[k]$ in the computation of H[k]. A similarly segmented and averaged estimate $\overline{\hat{\Phi}}_v[segment]$ is used instead of $\hat{\Phi}_v[k]$. In this way a single value of H[k], denoted $\overline{H}[segment]$ and defined by $$\overline{H}[segment] = \left(1 - \delta \left(\frac{\overline{\hat{\Phi}}_v[segment]}{\overline{\hat{\Phi}}_x[segment]}\right)^\alpha\right)^\beta$$

may be used for an entire segment and not just for a value k. A drawback of this method is that, due to the constant length and location of the segments, the important peaks of the spectrum may be split between several segments, as illustrated at MAX2 and MAX3 in FIG. 2. This leads to a poor resolution of these peaks. Furthermore, since the peaks may shift in position from speech frame to speech frame, they are sometimes split and sometimes not, which leads to very annoying "musical noise".

As illustrated by the exemplary algorithm presented below, the present invention solves this problem by dynamically adapting the length and position of the segments to the shape of the current estimate $\hat{\Phi}_x[k]$. Briefly, the algorithm starts by finding local maxima (peak positions) and local minima (valley positions) of $\hat{\Phi}_x[k]$. It then centers a segment on each maximum and distributes segments between the peaks to cover the valleys. When locating maxima and minima, a parametric spectrum estimate based on autoregression is especially attractive, since such a spectrum is guaranteed to have at most M/2 peaks, where M is the model order.

Preferably the length of individual segments is adapted to the properties of the human auditory system, which has been studied in [4]. Based on this information the following relation between segment center $f_c$ and segment length may be obtained (for a frequency range of 256 bins and a sampling frequency of 8000 Hz, which gives a frequency resolution of 31.25 Hz/bin):

$$segment(f_c) = \begin{cases} 93 \text{ Hz} & (3 \text{ bins}), & 0 \le f_c \le 906 \text{ Hz} \\ 155 \text{ Hz} & (5 \text{ bins}), & 906 < f_c \le 1417 \text{ Hz} \\ 218 \text{ Hz} & (7 \text{ bins}), & 1417 < f_c \le 1812 \text{ Hz} \\ 281 \text{ Hz} & (9 \text{ bins}), & 1812 < f_c \le 2250 \text{ Hz} \\ 343 \text{ Hz} & (11 \text{ bins}), & 2250 < f_c \le 2593 \text{ Hz} \\ 406 \text{ Hz} & (13 \text{ bins}), & 2593 < f_c \le 2937 \text{ Hz} \\ 468 \text{ Hz} & (15 \text{ bins}), & 2937 < f_c \le 3250 \text{ Hz} \\ 531 \text{ Hz} & (17 \text{ bins}), & 3250 < f_c \le 4000 \text{ Hz} \end{cases}$$

A conversion to the discrete frequency domain k gives:

$$segment(k_c) = \begin{cases} 3 \text{ bins}, & 0 \le k_c \le 29 \\ 5 \text{ bins}, & 29 < k_c \le 45 \\ 7 \text{ bins}, & 45 < k_c \le 58 \\ 9 \text{ bins}, & 58 < k_c \le 72 \\ 11 \text{ bins}, & 72 < k_c \le 83 \\ 13 \text{ bins}, & 83 < k_c \le 94 \\ 15 \text{ bins}, & 94 < k_c \le 104 \\ 17 \text{ bins}, & 104 < k_c \le 128 \end{cases}$$

Figure 5:
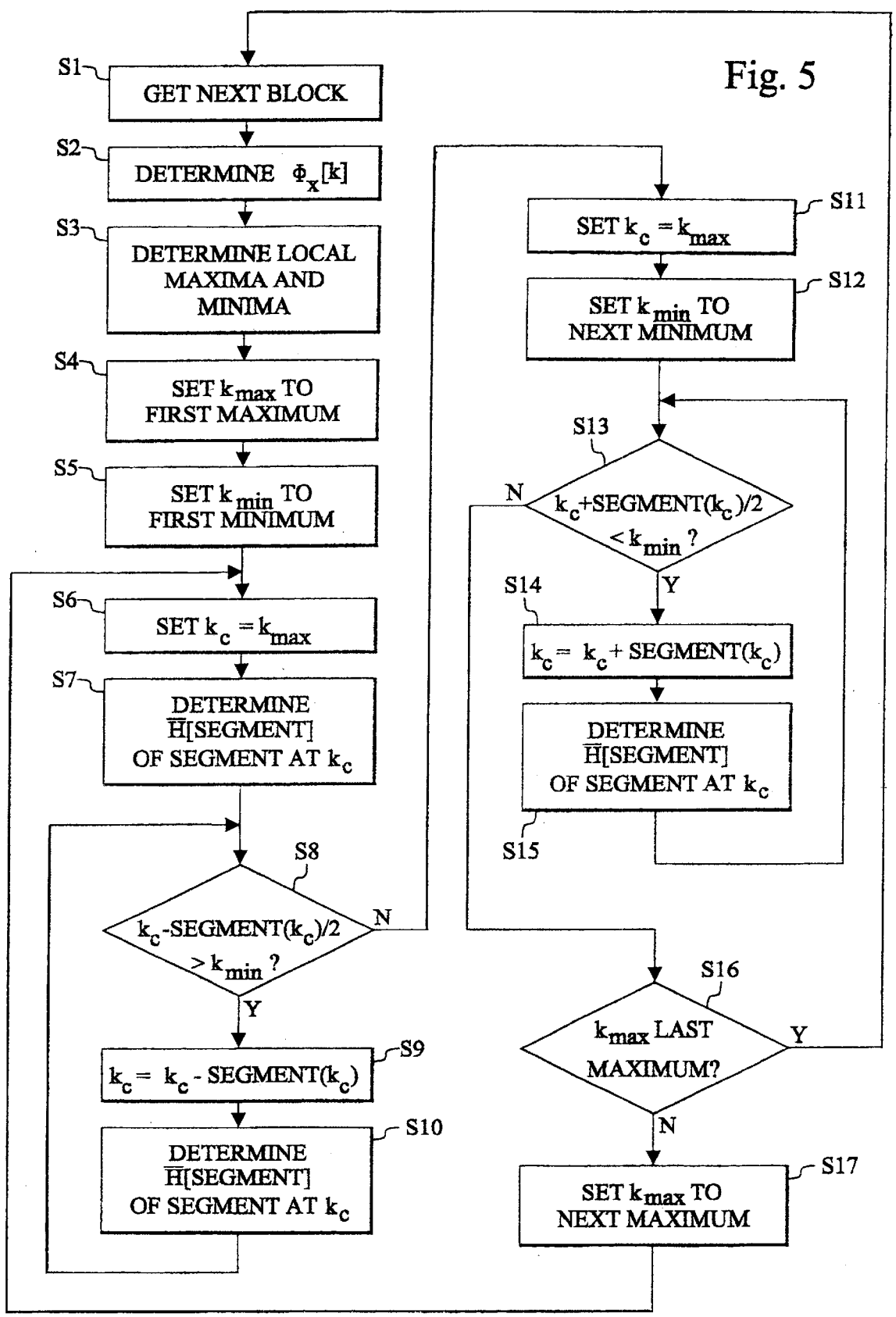
FIG. 5 is a flow chart illustrating an exemplary embodiment of the method in accordance with the present invention.

Using this relation, the following algorithm, which is also illustrated in FIG. 5, may be used to determine a segmented and averaged filter transfer function H[k] with dynamically determined segment lengths and positions:

S1: Get next signal block of x[n]
S2: Determine $\hat{\Phi}_x[k]$ of signal block
S3: Determine local maxima and minima of $\hat{\Phi}_x[k]$
S4: Set kmax to k-value of first maximum
S5: Set kmin to k-value of first minimum
S6: Set kc=kmax
S7: Determine average of $\hat{\Phi}_x[k]$ in segment(kc) centered on kc Determine average of $\hat{\Phi}_v[k]$ in the same segment Determine $\overline{H}[segment]$ using averaged $\hat{\Phi}_x[k]$ and $\hat{\Phi}_v[k]$
S8: If kc-segment(kc)/2>kmin, then perform S9–S10
S9: Set kc=kc-segment(kc) (the old value kc is used for segment(kc))
S10: Determine average of $\hat{\Phi}_x[k]$ in segment(kc) centered on kc Determine average of $\hat{\Phi}_v[k]$ in the same segment Determine $\overline{H}[segment]$ using averaged $\hat{\Phi}_x[k]$ and $\hat{\Phi}_v[k]$ Go to S8
S11: Set kc=kmax
S12: Set kmin to k-value of next minimum
S13: If kc+segment(kc)/2<kmin then perform S14–S15
S14: Set kc=kc-segment(kc) (the old value kc is used for segment(kc))
S15: Determine average of $\hat{\Phi}_x[k]$ in segment(kc) centered on kc Determine average of $\hat{\Phi}_v[k]$ in the same segment Determine $\overline{H}[segment]$ using averaged $\hat{\Phi}_x[k]$ and $\hat{\Phi}_v[k]$ Go to S13
S16: If kmax is the last maximum, go to S1
S17: Set kmax to k-value of next maximum and go to S6

Figure 4:
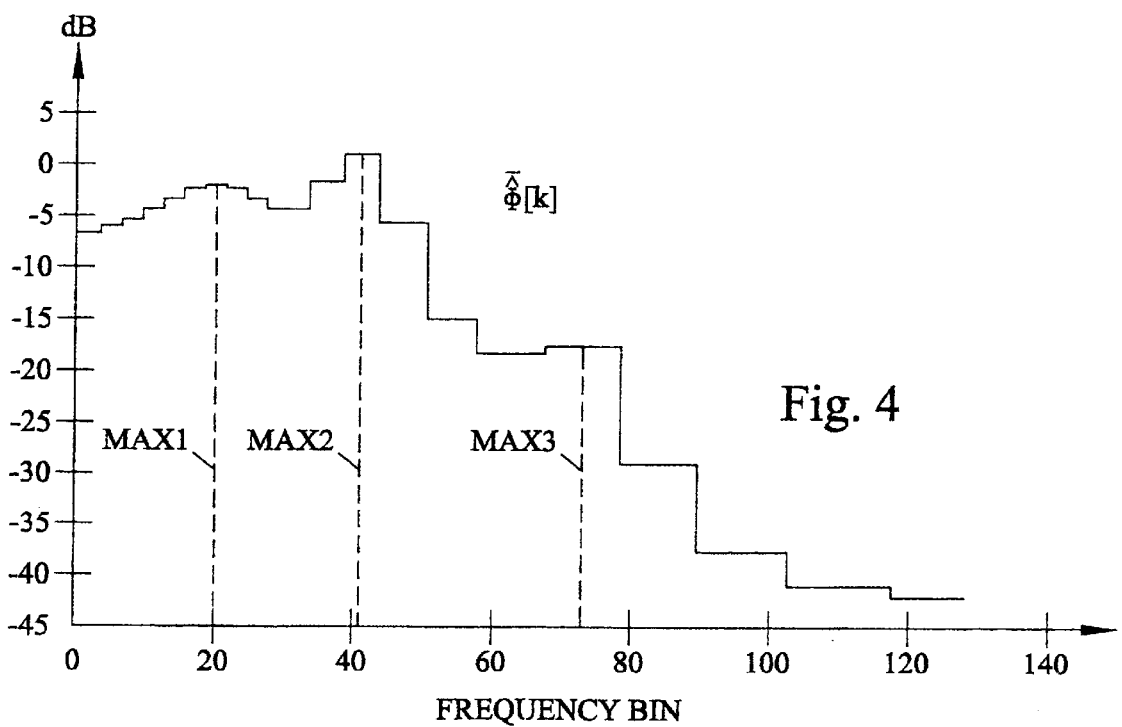
FIG. 4 is a diagram illustrating the power spectral density estimate in FIG. 1 after segmentation and averaging in accordance with the present invention.

Using this algorithm on the spectrum in FIG. 1 produces the segmented and averaged spectrum in FIG. 4. As an illustration, in FIG. 4 the local maxima are located at:
MAX1: k=20
MAX2: k=41
MAX3: k=73
and the local minima are located at:
MIN1: k=0
MIN2: k=31
MIN3: k=61
MIN4: k=128

Applying the algorithm above to the second maximum at k=41, for example, gives a 5 bin segment centered on k=41, two 5 bin segments to the left of the maximum and two 7 bin segments to the right of the maximum. When comparing FIG. 2 to FIG. 1, it is noted that segments covering a peak are always centered on the peak. Furthermore, it is noted that lower frequencies result in shorter segments. As noted above, if the peaks change position from frame to frame, the algorithm will guarantee that the segments are still centered on the peaks and that the segment width is adapted to the location of the peaks.

Figure 6:
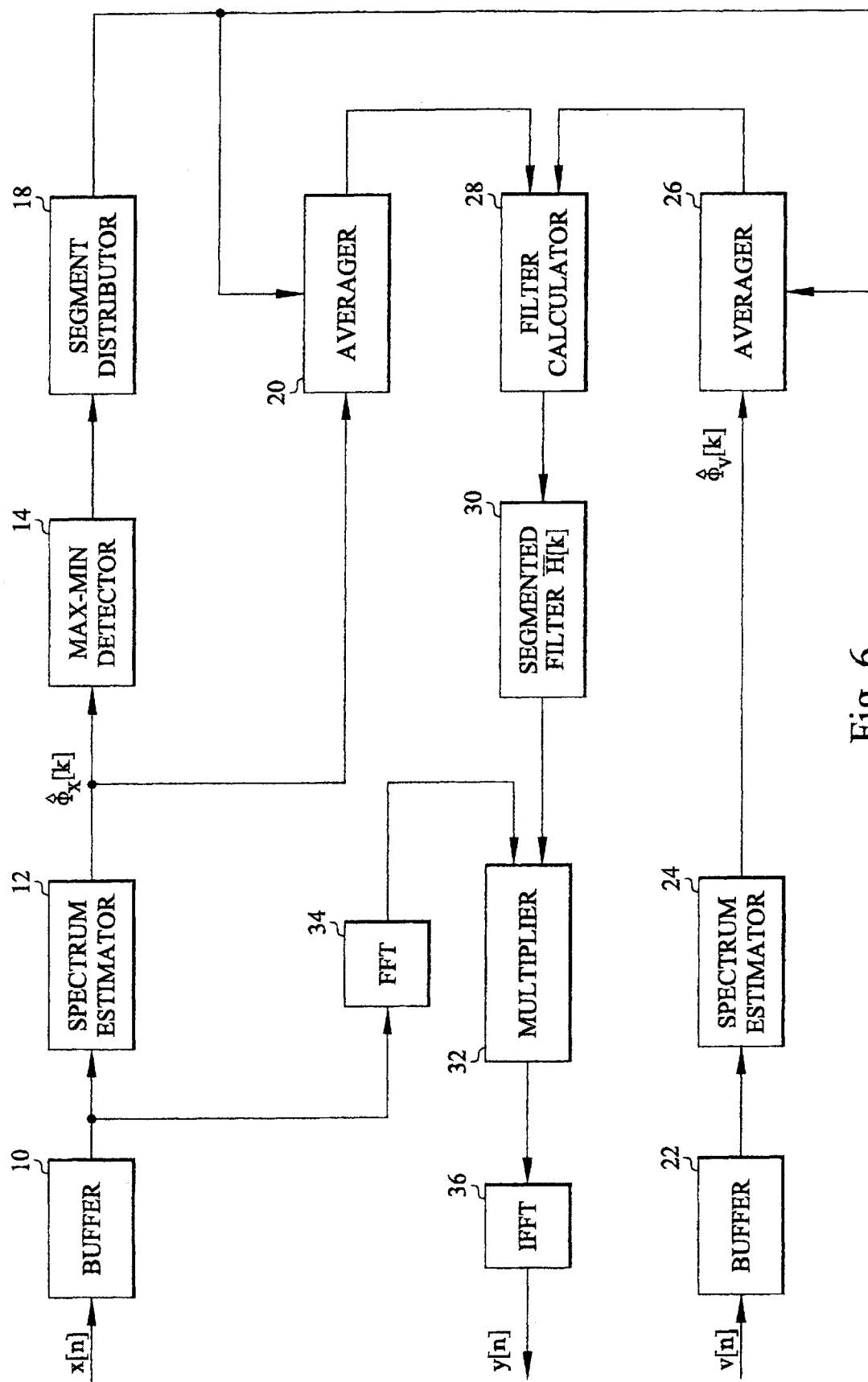
FIG. 6 is a block diagram illustrating an exemplary embodiment of a filter design and filtering apparatus in accordance with the present invention.

FIG. 6 is a block diagram illustrating an exemplary embodiment of a filter design apparatus in accordance with the present invention, in this case used for noise suppression by spectral subtraction. A stream of noisy speech samples x[n] are forwarded to a buffer 10, which collects a block or frame of samples. That is, the buffer collects the samples as blocks or frames in a "piece-wise" fashion for processing. A spectrum estimator 12 finds the AR parameters of this block and uses these parameters to determine the power spectral density estimate of the current block of the noisy speech signal x[n]. Typically this estimate has 128 or 256 samples. A max-min detector 14 searches the estimate for local maxima and minima. The locations of the local maxima and minima are forwarded to a segment distributor 18 that distributes the segments in accordance with the method described with reference to FIG. 5. The segment locations and lengths are forwarded to an averager 20. Averager 20 receives the samples of estimate and forms the average in each specified segment. During a block without speech, a block of background noise signal v[n] is collected in a buffer 22. A spectrum estimator 24 finds the AR parameters of this block and uses these parameters to determine the power spectral density estimate of the block of the background noise signal v[n]. This estimate has the same number of samples as estimate. The segment locations and lengths from segment distributor 18 are also forwarded to another averager 26. Averager 26 receives the samples of estimate and forms the average in each specified segment. Both averagers 20, 26 forward the average values in each segment to a filter calculator 28, which determines a value of the filter transfer function for each segment. This produces a segmented filter represented by block 30. This filter is forwarded to an input of a multiplier 32. The signal block in buffer 10 is also forwarded to a Fast Fourier Transform (FFT) block 34, which transforms the block to the frequency domain. The length of the transformed block is the same as the length of the segmented filter. The transformed signal is forwarded to another input of multiplier 32, where it is multiplied by the segmented filter. Finally, the filtered signal is transformed back to the time domain in an Inverse Fast Fourier Transform (IFFT) block 36.

Typically the different blocks in FIG. 6 are implemented by one or several micro processors or micro/signal processor combinations. They may, however, also be implemented by one or several ASICs (application specific integrated circuits).

A similar structure may be used for non-linear filtering in echo cancellation. In this case x[n] represents the residual echo contaminated signal and v[n] is replaced by an estimate of the residual echo e[n]. Another difference is that in this case the estimates $\hat{\Phi}_x[k]$ and $\hat{\Phi}_e[k]$ are from the same speech frame (in noise suppression by spectral subtraction the noise spectrum is considered stationary and estimated during speech pauses).

It will be understood by those skilled in the art that various modifications and changes may be made to the present invention without departure from the scope thereof, which is defined by the appended claims.

REFERENCES

[1] U.S. Pat. No. 5,839,101 (A. Vähitalo et al).
[2] J. S. Lim and A. V. Oppenheim, "Enhancement and bandwidth compression of noisy speech", Proc. of the IEEE, Vol. 67, No. 12, 1979, pp. 1586–1604.
[3] S. F. Boll, "Suppression of acoustic noise in speech using spectral subtraction", IEEE Trans. on Acoustics, Speech and Signal Processing, Vol. ASSP-27, No. 2, 1979, pp. 113–120.
[4] U. Zölser, "Digital audio signal processing", John Wiley & Sons, Chichester, U.K., 1997, pp. 252–253.

What is claimed is:

1. A digital filter design method for noise suppression by spectral subtraction, including the steps of:
   determining a high frequency-resolution noisy speech power spectral density estimate from a noisy speech signal block;
   forming a piece-wise constant noisy speech power spectral density estimate by averaging power densities within frequency bin segments of said noisy speech high frequency-resolution power spectral density estimate;
   determining a high frequency-resolution background noise power spectral density estimate from a background noise signal block;
   forming a piece-wise constant background noise power spectral density estimate by averaging power densities within frequency bin segments of said high frequency-resolution background noise power spectral density estimate;
   determining a piece-wise constant digital filter transfer function using spectral subtraction based on said piece-wise constant noisy speech power spectral density estimate and said piece-wise constant background noise power spectral density estimate;
   wherein said step of forming a piece-wise constant noisy speech power spectral density estimate includes adapting the length of individual segments to the shape of said high frequency-resolution noisy speech power spectral density estimate; and
   wherein said step of forming a piece-wise constant background noise power spectral density estimate includes using the same segments for both said high frequency-resolution noisy speech power spectral density estimate and said high frequency-resolution background noise power spectral density estimate.

2. The method of claim 1, including the step of centering segments on local maxima of said high frequency-resolution noisy speech power spectral density estimate.

3. The method of claim 2, including the step of increasing said segment length for high frequencies in accordance with the human auditory system.

4. The method of claim 1, including the step of increasing said segment length for high frequencies in accordance with the human auditory system.

5. A digital filter design method for non-linear echo cancellation, including the steps of:
   determining a high frequency-resolution speech power spectral density estimate from a residual echo containing speech signal block;
   forming a piece-wise constant speech power spectral density estimate by averaging power densities within frequency bin segments of said speech high frequency-resolution power spectral density estimate;
   determining a high frequency-resolution residual echo power spectral density estimate from an echo signal block;
   forming a piece-wise constant residual echo power spectral density estimate by averaging power densities within frequency bin segments of said high frequency-resolution residual echo power spectral density estimate;

determining a piece-wise constant digital filter transfer function using said piece-wise constant speech power spectral density estimate and said piece-wise constant residual echo power spectral density estimate;

wherein said step of forming a piece-wise constant speech power spectral density estimate includes adapting the length of individual segments to the shape of said high frequency-resolution speech power spectral density estimate; and wherein said step of forming a piece-wise constant residual echo power spectral density estimate includes using the same segments for both said high frequency-resolution speech power spectral density estimate and said high frequency-resolution residual echo power spectral density estimate.

6. The method of claim 5, including the step of centering segments on local maxima of said high frequency-resolution speech power spectral density estimate.

7. The method of claim 6, including the step of increasing said segment length for high frequencies in accordance with the human auditory system.

8. The method of claim 5, including the step of increasing said segment length for high frequencies in accordance with the human auditory system.

9. A digital filter design method, including the steps of:
determining a high frequency-resolution power spectral density estimate from an input signal block;
forming a piece-wise constant power spectral density estimate by averaging power densities within frequency bin segments of said high frequency resolution power spectral density estimate;
determining a piece-wise constant digital filter transfer function using said piece-wise constant power spectral density estimate;
wherein said step of forming a piece-wise constant power spectral density estimate includes adapting the length of individual segments to the shape of said high frequency-resolution power spectral density estimate.

10. The method of claim 9, including the step of centering segments on local maxima of said high frequency-resolution power spectral density estimates.

11. A digital filter design apparatus for noise suppression by spectral subtraction, including:
means for determining a high frequency-resolution noisy speech power spectral density estimate from a noisy speech signal block;
means for forming a piece-wise constant noisy speech power spectral density estimate by averaging power densities within frequency bin segments of said noisy speech high frequency-resolution power spectral density estimate;
means for determining a high frequency-resolution background noise power spectral density estimate from a background noise signal block;
means for forming a piece-wise constant background noise power spectral density estimate by averaging power densities within frequency bin segments of said high frequency-resolution background noise power spectral density estimate;
means for determining a piece-wise constant digital filter transfer function using spectral subtraction based on said piece-wise constant noisy speech power spectral density estimate and said piece-wise constant back ground noise power spectral density estimate;
means for adapting the length of individual segments to the shape of said high frequency-resolution noisy speech power spectral density estimate; and
means for using the same segments for both said high frequency resolution noisy speech power spectral density estimate and said high frequency-resolution background noise power spectral density estimate.

12. The apparatus of claim 11, including means for centering segments on local maxima of said high frequency-resolution noisy speech power spectral density estimate.

13. The apparatus of claim 12, including means for increasing said segment length for high frequencies in accordance with the human auditory system.

14. The apparatus of claim 11, including means for increasing said segment length for high frequencies in accordance with the human auditory system.

15. A digital filter design apparatus for non-linear echo cancellation, including:
means for determining a high frequency-resolution speech power spectral density estimate from a residual echo containing speech signal block;
means for forming a piece-wise constant speech power spectral density estimate by averaging power densities within frequency bin segments of said speech high frequency-resolution power spectral density estimate;
means for determining a high frequency-resolution residual echo power spectral density estimate from an echo signal block;
means for forming a piece-wise constant residual echo power spectral density estimate by averaging power densities within frequency bin segments of said high frequency-resolution residual echo power spectral density estimate;
means for determining a piece-wise constant digital filter transfer function using said piece-wise constant speech power spectral density estimate and said piece-wise constant residual echo power spectral density estimate;
means for adapting the length of individual segments to the shape of said high frequency-resolution speech power spectral density estimate; and;
means for using the same segments for both said high frequency resolution speech power spectral density estimate and said high frequency resolution residual echo power spectral density estimate.

16. The apparatus of claim 15, including means for centering segments on local maxima of said high frequency-resolution speech power spectral density estimate.

17. The apparatus of claim 16, including means for increasing said segment length for high frequencies in accordance with the human auditory system.

18. The apparatus of claim 15, including means for increasing said segment length for high frequencies in accordance with the human auditory system.

19. A digital filter design apparatus, including
means for determining a high frequency-resolution power spectral density estimate from an input signal block;
means for forming a piece-wise constant power spectral density estimate by averaging power densities within frequency bin segments of said high frequency-resolution power spectral density estimate;
means for determining a piece-wise constant digital filter transfer functions using said piece-wise constant power spectral density estimate; and
means for adapting the length of individual segments to the shape of said high frequency-resolution power spectral density estimate.

20. The apparatus of claim 19, further including means for centering segments on local maxima of said high frequency-resolution power spectral density estimates.

* * * * *